(12) United States Patent
Lesea (10) Patent No.: US 6,351,145 B1
(45) Date of Patent: Feb. 26, 2002

(54) REALIZING ANALOG-TO-DIGITAL CONVERTER ON A DIGITAL PROGRAMMABLE INTEGRATED CIRCUIT

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/827,615

(22) Filed: Apr. 6, 2001

Related U.S. Application Data (62) Division of application No. 09/337,855, filed on Jun. 21, 1999.

(51) Int. Cl.[7] .......................................... H03K 19/177
(52) U.S. Cl. .................................. 326/41; 326/38
(58) Field of Search ..................... 326/37–41

(56) References Cited

U.S. PATENT DOCUMENTS

| | | | |
|---|---|---|---|
| 4,609,906 A | 9/1986 | Wiegel | 341/155 |
| 4,758,746 A | 7/1988 | Birkner et al. | 307/465 |

(List continued on next page.)

OTHER PUBLICATIONS

John Logue; Xilinx Application Note XAPP155, entitled "Virtex Analog to Digital Converter", Sep. 23, 1999 (Version 1.1); pp. 1–8; available from Xilinx, Inc., 2100 Logic Drive, San Jose, cA 95124.
John Logue; Xilinx Application Note XAPP154, entitled "Virtex Synthesizable Delta–Sigma DAC", Sep. 23, 1999 (Version 1.1); pp. 1–8; available from Xilinx, Inc., 2100 Logic Drieve, San Jose, CA 95124.

Xilinx Application Note XAPP 133, entitled "Using the Virtex SelectiO", Oct. 21, 1998 (Version 1.11); pp. 1–12; available from Xilinx, Inc., 2100 Logic Drive, San Jose, CA 95124.

Xcell; The Quarterly Journal for Programmable Logic Users; Issue 31, First Quarter 1999, pp. 2, 4–5, 41–53; published by Xilinx, Inc. 2100 Logic Drive, San Jose, CA 95124.

*Primary Examiner*—Michael Tokar
*Assistant Examiner*—Don Phu Le
(74) *Attorney, Agent, or Firm*—Edel M. Young; T. Lester Wallace, E (57) ABSTRACT

An analog-to-digital converter (ADC) is realized in a field programmable gate array (FPGA) without adding special dedicated analog circuitry. In a digital application, a comparator in an interface cell of the FPGA compares an incoming digital signal to a reference voltage. Adjusting of the reference voltage allows the interface cell to support different digital I/O standards. In one embodiment, the comparator is not used for this digital purpose, but rather is used as a comparator in an ADC. A flash ADC is realized by using the comparators of numerous interface cells as the comparators of the flash ADC. Conversion speed is increased by reducing the impedance of the analog signal input path. An on-chip resistor string is provided so that the flash ADC can be realized without external components. In another embodiment, the comparator of the interface cell is the comparator of a successive approximation ADC. In some embodiments, an interface cell has a pad that is usable for receiving a digital signal or for receiving an analog signal. The interface cell includes special dedicated analog circuitry that has a differential input lead that is programmably couplable to the pad.

1 Claim, 7 Drawing Sheets

U.S. PATENT DOCUMENTS

| | | | |
|---|---|---|---|
| 4,853,560 A | 8/1989 | Iwamura et al. | 307/296.1 |
| 4,860,012 A | 8/1989 | Rich et al. | 341/143 |
| 4,942,318 A | 7/1990 | Kawana | 307/465 |
| 4,952,934 A | 8/1990 | Chiriatti | 341/142 |
| 5,023,484 A | 6/1991 | Pathak et al. | 307/465 |
| 5,027,011 A | 6/1991 | Steele | 307/465 |
| 5,107,146 A | 4/1992 | El-Ayat | 307/465 |
| 5,153,462 A | 10/1992 | Agrawal et al. | 326/39 |
| 5,194,867 A | 3/1993 | Fisher | 341/159 |
| 5,196,740 A | 3/1993 | Austin | 307/303 |
| 5,200,751 A | 4/1993 | Smith | 341/147 |
| 5,298,806 A | 3/1994 | Sako | 307/465 |
| 5,300,835 A | 4/1994 | Assar et al. | 307/475 |
| RE34,808 E | 12/1994 | Hsieh | 326/71 |
| 5,450,082 A | 9/1995 | Finley et al. | 341/155 |
| 5,457,644 A | 10/1995 | McCollum | 364/716 |
| 5,521,530 A | 5/1996 | Yao et al. | 326/80 |
| 5,563,526 A | 10/1996 | Hastings et al. | 326/37 |
| 5,671,234 A | 9/1997 | Phillips et al. | 371/22.3 |
| 5,677,691 A | 10/1997 | Hosticka et al. | 341/155 |
| 5,786,710 A | 7/1998 | Graf | 326/40 |
| 5,801,657 A | 9/1998 | Fowler et al. | 341/155 |
| 5,815,100 A | 9/1998 | Rush et al. | 341/110 |
| 5,821,776 A | 10/1998 | McGowan | 326/41 |
| 5,877,632 A | 3/1999 | Goetting et al. | 326/50 |

| ANALOG INPUT VOLTAGE (VIN) | ENCODER INPUT | ENCODER OUTPUT |
|---|---|---|
| 7/8VCC - VCC | 1000 0000 | 111 |
| 6/8VCC - 7/8VCC | 1100 0000 | 110 |
| 5/8VCC - 6/8VCC | 1110 0000 | 101 |
| 4/8VCC - 5/8VCC | 1111 0000 | 100 |
| 3/8VCC - 4/8VCC | 1111 1000 | 011 |
| 2/8VCC - 3/8VCC | 1111 1100 | 010 |
| 1/8VCC - 2/8VCC | 1111 1110 | 001 |
| GND - 1/8VCC | 1111 1111 | 000 |

REALIZING ANALOG-TO-DIGITAL CONVERTER ON A DIGITAL PROGRAMMABLE INTEGRATED CIRCUIT

This Appln is a Div of Ser. No. 09/337,855 filed Jun. 21, 1999.

FIELD OF THE INVENTION

This invention relates generally to methods and circuit configurations for realizing analog circuitry, particularly analog-to-digital converters, on digital programmable integrated circuits.

BACKGROUND INFORMATION

Figure 1:
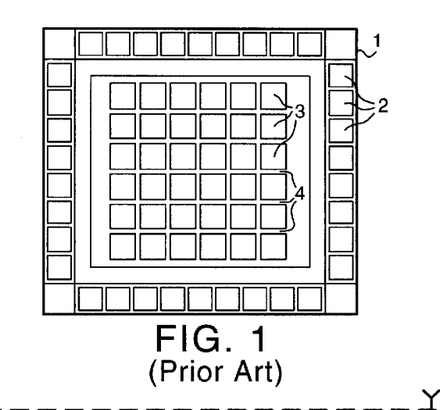
FIG. 1 (Prior Art) is a simplified top-down diagram of a field programmable gate array (FPGA) integrated circuit.

FIG. 1 (Prior Art) is a simplified top-down diagram illustrative of a field programmable gate array (FPGA) integrated circuit 1. Integrated circuit 1 includes a ring of interface cells 2, an inner core of configurable logic blocks 3, and a programmable interconnect structure 4. The programmable interconnect structure 4 is configurable by a user to connect selected digital logic elements within selected configurable logic blocks together so as to realize a user-specific circuit. Digital signals are supplied to FPGA 1 via the interface cells 2 and digital signals are output from FPGA 1 via the interface cells 2. U.S. Reissue Patent Re. 34,363 to Freeman describes the first FPGA and is incorporated herein by reference.

Figure 2:
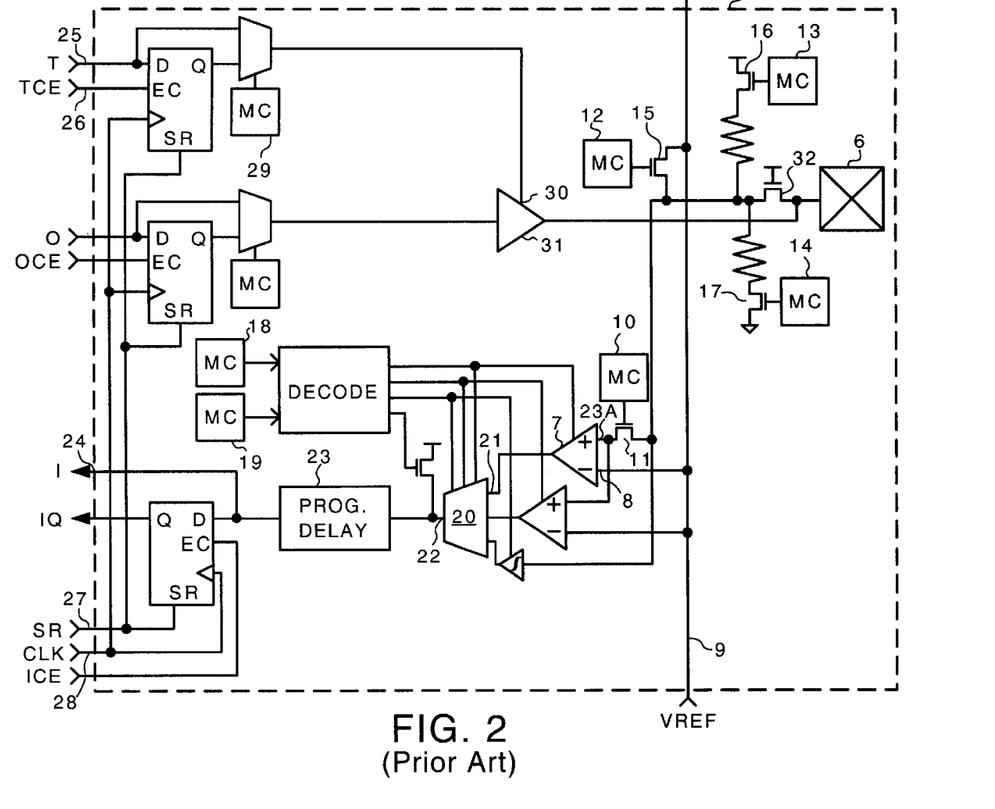
FIG. 2 (Prior Art) is a simplified top-down circuit diagram of an interface cell of the field programmable gate array of FIG. 1.

FIG. 2 (Prior Art) is a simplified top-down circuit diagram of an interface cell 5 of FPGA 1 that receives a digital signal via a bonding pad 6. According to one I/O standard, a voltage between zero and 1.5 volts is considered a digital zero whereas a voltage between 1.5 volts and 3.3 volts is considered a digital one. A comparator 7 is therefore provided to compare the digital signal on pad 6 to a 1.5 volt reference voltage VREF. The 1.5 volt reference voltage VREF is supplied to the inverting input lead 8 of comparator 7 by a reference voltage conductor 9. Reference voltage conductor 9 is a 0.28 micron wide metal trace about one millimeter long having a distributed series resistance of approximately 150,000 ohms per meter and a capacitance of approximately 250 picofarads per meter. The length of this conductor and its routing is due to its use as a low speed voltage reference conductor. It therefore has a relatively long length, high resistance, and high capacitance when compared to a high speed signal conductor.

Reference voltage conductor 9 extends parallel to an edge of FPGA 1 through many such interface cells so that the reference voltage VREF is supplied to the comparators of many such interface cells. Memory cell 10 is programmed so that transistor 11 is conductive. Memory cells 12–14 are programmed so that transistors 15–17 are nonconductive. Memory cells 18 and 19 are programmed so that comparator 7 is enabled and so that multiplexer 20 couples its upper input lead 21 to its output lead 22. A digital signal on pad 6 is therefore supplied to the noninverting input lead 23A of comparator 7 and is compared to the reference voltage VREF on conductor 9. If the magnitude of the digital signal is greater than voltage VREF, then comparator 7 outputs a digital one. This digital one passes through multiplexer 20, through programmable delay circuit 23, and to the inner core of FPGA 1 via input conductor 24. If, on the other hand, the magnitude of the digital signal on input pad 6 is less than voltage VREF, then comparator 7 outputs a digital zero and that digital zero passes to the inner core of FPGA 1 via input conductor 24.

One of the interface cells 2 is dedicated to the function of supplying the reference voltage VREF to conductor 9 for use by other interface cells. Reference voltage VREF is supplied to the pad 6 of this interface cell by an external source. Memory cell 12 of this interface cell is programmed so that transistor 15 is conductive and so that the reference voltage VREF on the pad is supplied to reference voltage conductor 9.

Interface cell 5 can also be used to output a digital signal from FPGA 1. By proper control of conductors 25–28 and memory cell 29, an enable signal is placed on enable lead 30 of output buffer 31. Output buffer 31 is therefore enabled and drives a digital signal onto pad 6. Transistor 32 is an input protection transistor, the gate of which is supplied with the supply voltage. Memory cells 13 and 14 are programmed so that one, both, or neither of transistors 16 and 17 are conductive depending on whether a pullup is desired, a pulldown is desired, or a weak keeper is desired. For additional background information on such an interface cell, see U.S. Pat. No. 5,877,632 (the subject matter of which is incorporated herein by reference).

It has been desired to incorporate analog function circuits into programmable devices and field programmable gate arrays. Such integrated circuits are often referred to as "mixed mode" circuits or "mixed signal" integrated circuits because they involve both analog function circuits and digital circuitry. Reference is made to the mixed mode integrated circuits disclosed in U.S. Pat. Nos. 5,107,146, 5,457,644, 5,563,526 and 5,821,776. Such mixed mode integrated circuits often have a digital portion where the digital functions are carried out and a separate analog portion where the analog functions are carried out.

Although such mixed mode integrated circuits may be well suited for particular applications, providing such a portion of dedicated analog circuitry may be wasteful in other applications. For example, some applications require only a small amount of analog functionality. Use of an integrated circuit with a significant amount of dedicated analog circuitry may therefore result in much of the integrated circuit not being used. Providing unused circuitry can be expensive. Alternatively, some applications require no analog functionality. In such applications, much and possibly all of the integrated circuit area used to realize the analog circuitry would be wasted. A solution is desired.

SUMMARY

A digital programmable integrated circuit (for example, a field programmable gate array) has an interface cell. The interface cell includes a comparator and a pad. The interface cell can be programmed such that the comparator receives a digital input signal from the pad of the programmable integrated circuit. If the digital signal from the pad is smaller than the reference voltage, then the comparator outputs a first digital logic level. If the digital signal from the pad is larger than the reference voltage, then the comparator outputs a second digital logic level. The interface cell can also be programmed such that the comparator receives an analog signal and is part of an analog-to-digital converter.

In accordance with one embodiment, the comparator is the comparator of a successive approximation analog-to-digital converter comprised of two parts: the comparator, and a delta-sigma digital-to-analog converter. A delta-sigma digital-to-analog converter converts a digital signal coded in a set of bits into a pulse train whose duty cycle represents the analog value.

In accordance with another embodiment, the comparators of multiple such interface cells constitute the comparators of a flash analog-to-digital converter (the term "flash" refers to many comparisons in parallel resulting in fast conversion).

Accordingly, identical programmable integrated circuits can be used by a first user who does not wish to realize analog circuitry as well as a second user who does wish to realize analog circuitry. The first user can use the comparator of an interface cell in his/her programmable integrated circuit to receive a digital signal whereas the second user can use the corresponding comparator in his/her programmable integrated circuit to realize an analog-to-digital converter. The use of the comparator for either receiving a digital signal or as part of an analog-to-digital converter makes the programmable integrated circuit more versatile and relaxes the need to include special dedicated analog circuitry into the programmable integrated circuit.

In one embodiment, a field programmable gate array has two interface cells of substantially identical structure. Each interface cell has a comparator and a first pad. The comparator of the first interface cell is used to receive a digital signal applied to the field programmable gate array at the first pad. The comparator of the second interface cell is a comparator of an analog-to-digital converter. Digital circuitry of the analog-to-digital converter is realized on the field programmable gate array by appropriate programming of configurable logic blocks in an inner core of the field programmable gate array. A first differential input lead of the comparator is coupled to the first pad of the interface cell and is programmably couplable to a tap of an on-chip resistor string. A second differential input lead of the comparator is programmably couplable to either a reference voltage conductor or to a second pad of the interface cell.

In some embodiments, a comparator dedicated for analog purposes is provided in an interface cell. If a digital signal is to be received on a pad of the interface cell, then the digital signal from the pad is supplied to a node of the interface cell. The digital signal may, for example, be supplied to the node via another comparator that compares the digital signal on the pad to a reference voltage. If, on the other hand, an analog signal is to be received on the pad, then the analog signal from the pad is supplied to a differential input lead of the comparator that is dedicated for analog purposes. A digital signal on an output lead of this comparator is supplied to the node of the interface cell. The interface cell may have a second pad that is programmably couplable to a second differential input lead of the comparator for analog purposes. A single pad of a field programmable gate array is therefore usable for receiving a digital signal or for receiving an analog signal. Memory cells are provided in the interface cell so that a user can configure the interface cell for receiving a digital signal on the pad or for receiving an analog signal on the pad.

Other structures and methods are disclosed in the detailed description below. This summary does not purport to define the invention. The invention is defined by the claims.

DETAILED DESCRIPTION

Figure 3:
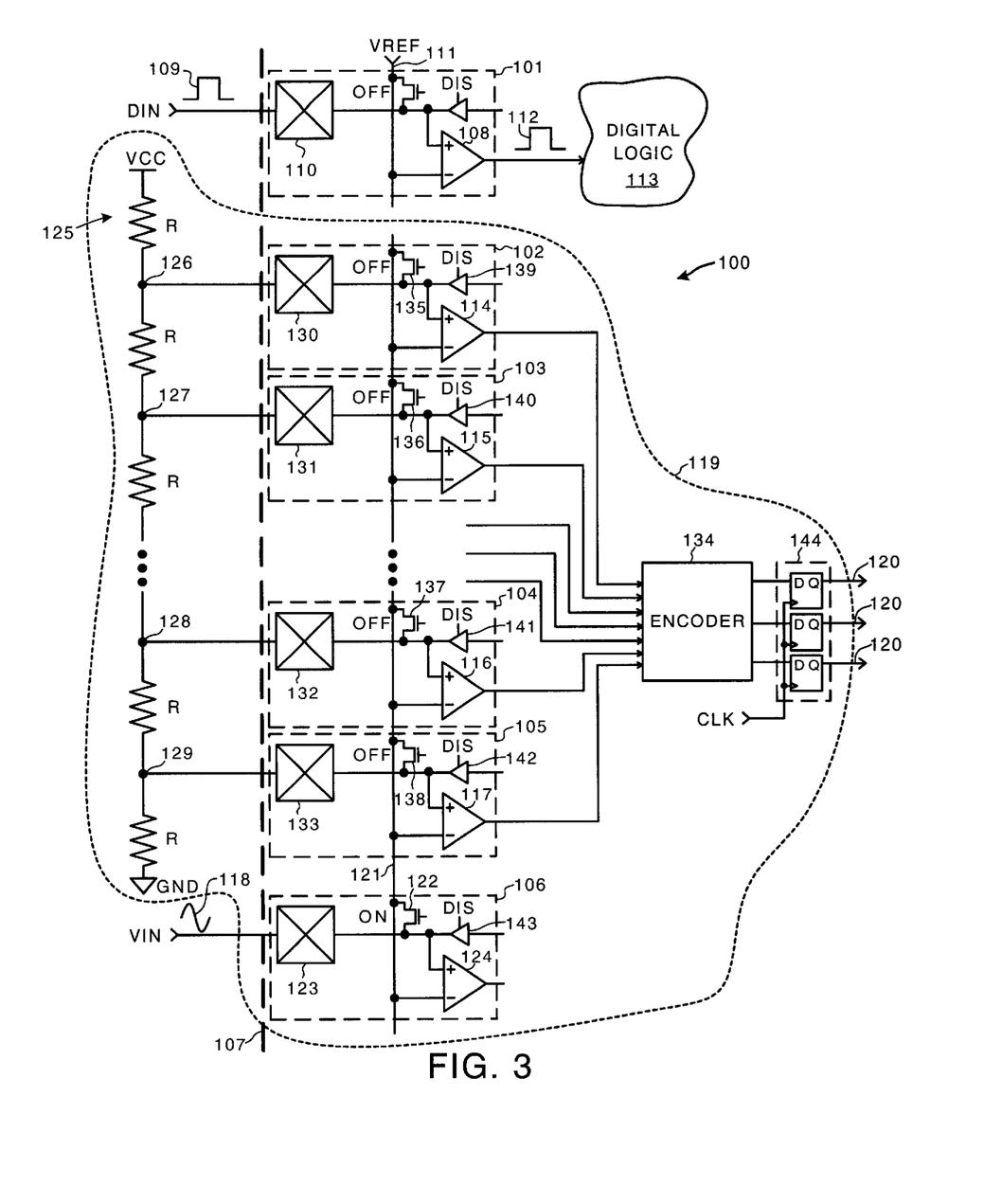
FIG. 3 is a simplified top-down diagram in accordance with an embodiment of the present invention wherein comparators in interface cells that are ordinarily used for receiving digital signals are used as the comparators of a flash analog-to-digital converter.

FIG. 3 is a simplified diagram of part of a field programmable gate array 100. Field programmable gate array 100 includes a ring of interface cells and an inner core of configurable logic blocks (see FIG. 1). In one embodiment, the configurable logic blocks are the configurable logic blocks of the Virtex family of field programmable gate arrays available from Xilinx, Inc. of San Jose, Calif. For additional information on the structure and use of Virtex field programmable gate arrays, configurable logic blocks and interface cells, see: (1) "Virtex Data Sheet", Xcell—The Quarterly Journal For Programmable Logic Users, issue 31, pages 41–53 (first quarter 1999); (2) "Using The Virtex SelectIO", XAPP133, version 1.11, pages 1–12 (Oct. 21, 1998); and (3) U.S. Pat. No. 5,877,632 entitled "FPGA With a Plurality of I/O Voltage Levels". (The subject matter of these three documents is incorporated herein by reference.)

FIG. 3 illustrates a plurality of interface cells 101–106 disposed along an edge 107 of the field programmable gate array 100 integrated circuit. Each of the interface cells has a substantially identical structure. Each interface cell has a comparator and a pad. The comparator 108 of interface cell 101 receives a digital signal 109 from pad 110 and compares the digital signal to a reference voltage VREF on a common (vertically extending) reference voltage conductor 111. If the voltage of the digital signal is greater than the reference voltage, then comparator 108 supplies a digital logic one digital signal 112 to digital logic 113 in the inner core of the field programmable gate array. If, on the other hand, the voltage of the digital signal is smaller than the reference voltage, then comparator 108 supplies a digital logic zero digital signal 112 to digital logic 113 in the inner core of the field programmable gate array.

Whereas comparator 108 receives a digital signal, comparators 114–117 receive an analog signal VIN 118 and are part of a flash analog-to-digital converter 119. Flash analog-to-digital converter 119 outputs a multi-bit digital value on digital output leads 120 that is indicative of a magnitude of the voltage of analog signal VIN 118.

Interface cell 106 is dedicated to supplying analog signal VIN 118 onto a vertically extending reference voltage conductor 121. Transistor 122 is therefore made to be conductive. Analog signal VIN 118 on pad 123 is conducted from pad 123, through conductive transistor 122, and onto reference voltage conductor 121. In this embodiment, comparator 124 of interface cell 106 is not used. Interface cell 106 is only used to supply analog signal VIN 118 onto reference voltage conductor 121. Analog signal VIN 118 is supplied via reference voltage conductor 121 to the inverting differential input leads of comparators 114–117.

In the embodiment of FIG. 3, there are two banks of interface cells. The comparators of the first bank are coupled to first reference voltage conductor 111 that carries the reference voltage VREF whereas the comparators of the second bank are coupled to the second reference voltage conductor 121 that carries the analog input voltage VIN 118. Interface cell 101 is an interface cell in the first bank. Interface cells 102–106 are interface cells in the second bank.

Flash analog-to-digital converter 119 also includes an off-chip seven tap resistor string 125. Each respective tap 126–129 of the resistor string 125 is coupled to a corresponding one of pads 130–133. Although only four interface cells 102–105 are illustrated coupled to the resistor string, it is understood that the flash analog-to-digital converter 119 is a three bit analog-to-digital converter and that there are actually seven such interface cells. The pad of each of these seven interface cells is coupled to a corresponding one of seven taps on the resistor string. Accordingly, the comparator of each of the seven interface cells 102–105 compares the voltage on a corresponding tap of the resistor string to the analog signal VIN 118 on reference conductor 121 and outputs a digital logic signal to an encoder 134.

In this embodiment, the resistors making up resistor string 125 all have approximately the same resistance R. One end of resistor string 125 is coupled to a supply voltage VCC whereas the other end is coupled to ground potential GND. In the method of the embodiment, transistors 135–138 are made to be nonconductive and output buffers 139–143 are disabled.

Figure 4:
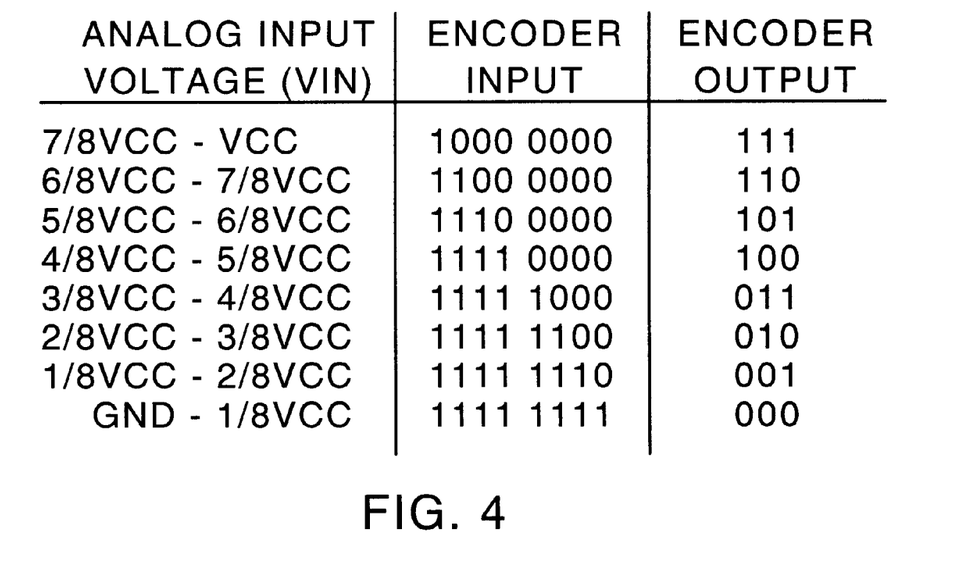
FIG. 4 is a table that describes the operation of an encoder of the flash analog-to-digital converter of FIG. 3.

Encoder 134 encodes the seven bit digital signal received from comparators 114–117 into a three bit digital value in accordance with the table of FIG. 4. Encoder 134 may, for example, be realized as a plurality of logic gates. The three bit digital value output by encoder 134 is latched by a register 144. Register 144 is clocked by a clock signal CLK. Digital logic 113, encoder 134 and register 144 are realized in configurable logic blocks of the inner core of the field programmable gate array. Comparators 108 and 114–117 and 124 are structurally identical comparators. Encoding may also correct for inaccuracies in the conversion by the use of a calibration cycle and subsequent modification of the truth table values in FIG. 4.

Figure 5:
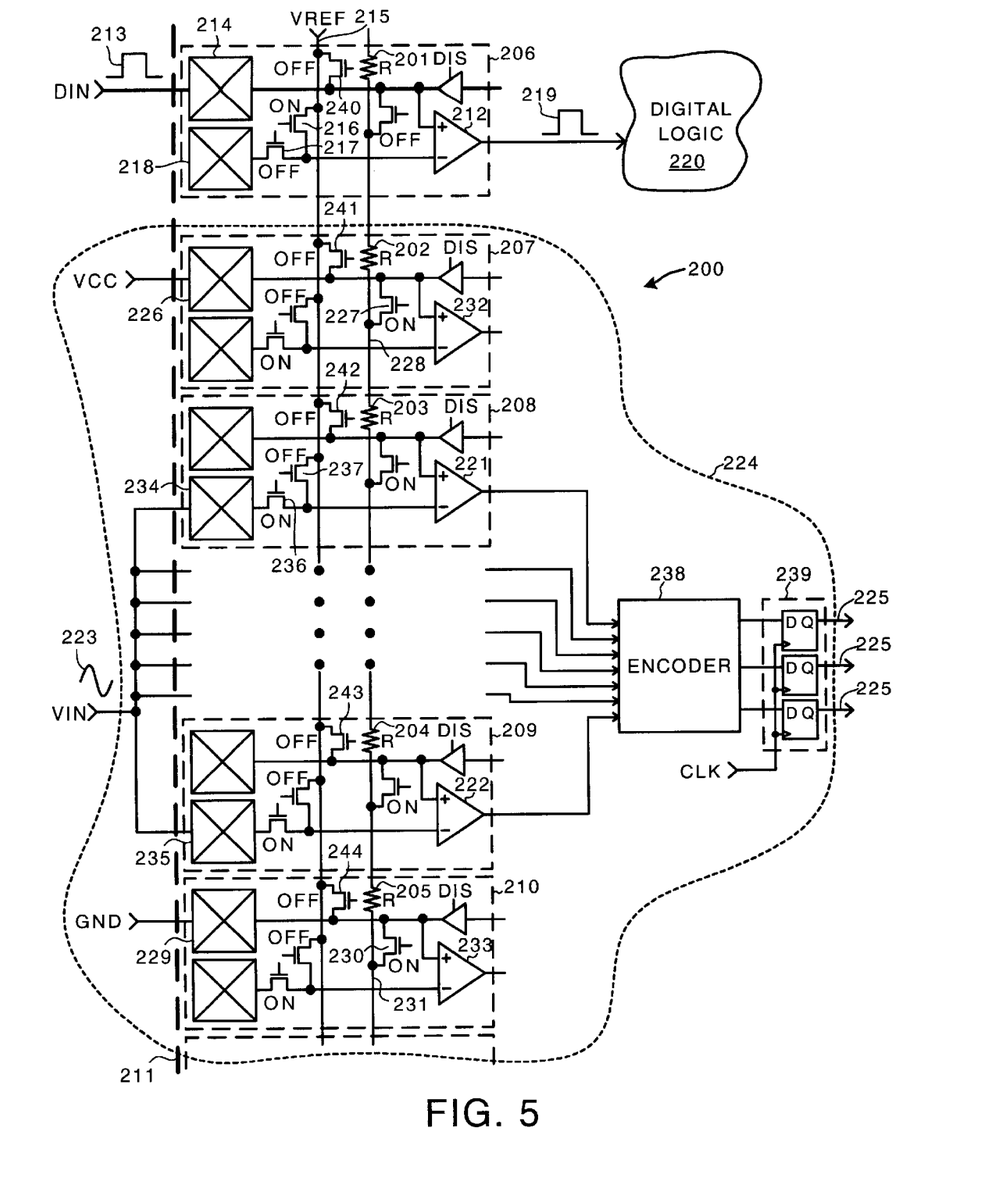
FIG. 5 is a simplified top-down diagram in accordance with another embodiment of the present invention wherein comparators in interface cells that are ordinarily used for receiving digital signals are used as the comparators of a flash analog-to-digital converter.

FIG. 5 is a simplified diagram of a field programmable gate array 200 in accordance with another embodiment. In this embodiment, the field programmable gate array 200 includes an on-chip resistor string comprising resistors 201–205. A plurality of interface cells 206–210 is disposed along an edge 211 of the field programmable gate array 200 integrated circuit. Each of the interface cells has a substantially identical structure. Each interface cell includes a comparator, a first pad coupled to a noninverting differential input lead of the comparator, means for programmably coupling the noninverting differential input lead to a tap of the resistor string, a second pad, and means for programmably coupling an inverting differential input lead of the comparator to either a reference voltage conductor or to the second pad.

In the embodiment of FIG. 5, comparator 212 of interface cell 206 receives a digital signal 213 from first pad 214 and compares the digital signal to a reference voltage VREF on vertically extending reference voltage conductor 215. The digital signal 213 passes from first pad 214 to the noninverting differential input lead of comparator 212 without being amplified. According to a method using the embodiment of FIG. 5, transistor 216 is made conductive and transistor 217 is made nonconductive so that the inverting differential input lead of comparator 212 is coupled to reference voltage conductor 215 and not to second pad 218.

If the voltage of the digital signal 213 is greater than the reference voltage VREF, then comparator 212 supplies a digital logic one digital signal 219 to digital logic 220 in the inner core of the field programmable gate array. If, on the other hand, the voltage of the digital signal is smaller than the reference voltage VREF, then comparator 212 supplies a digital logic zero digital signal 219 to digital logic 220 in the inner core of the field programmable gate array.

Whereas comparator 212 receives a digital signal, seven comparators 221–222 (only two of the comparators are illustrated for clarity due to the limitation of space) receive an analog signal VIN 223 and are part of a flash analog-to-digital converter 224. Flash analog-to-digital converter 224 outputs a multi-bit digital value on digital output leads 225 that is indicative of a magnitude of the voltage of analog signal VIN 223.

Interface cell 207 is dedicated to coupling a first end of an on-chip resistor string comprising eight resistors 203–205 to a supply voltage VCC on first pad 226 (only three of the eight resistors of the resistor string are illustrated for clarity due to the limitation of space). Transistor 227 is made to be conductive so that first pad 226 of interface cell 207 is coupled the first end (node 228) of the resistor string. The resistors of the resistor string are in one embodiment isolated N-well resistors having a resistance of approximately 1000 ohms each.

Similarly, interface cell 210 is dedicated to coupling a second end of the resistor string comprising the eight resistors 203–205 to ground potential GND on first pad 229. Transistor 230 is therefore made to be conductive so that first pad 229 of interface cell 210 is coupled to the second end (node 231) of the resistor string. In this embodiment, comparators 232 and 233 are not used.

Analog signal VIN 223 is supplied to the seven second pads 234–235 of the seven interface cells 208–209. Again, only two of the seven interface cells are illustrated due to space limitations. The second pad in each of these seven interface cells is coupled to the inverting differential input lead of the comparator of the interface cell. In interface cell 208, for example, second pad 234 is coupled to the inverting differential input lead of comparator 221 by making transistor 236 conductive. Transistor 237 is made nonconductive so that the inverting input lead is not coupled to the vertically extending reference voltage conductor 215. Accordingly, each of the seven comparators 221–222 compares the voltage on a corresponding tap on the resistor string to the analog signal VIN and outputs a digital logic signal to an encoder 238. Encoder 238 encodes the seven bit digital signal received from comparators 221–222 into a three bit digital value in accordance with the table of FIG. 4. Encoder 238 may, for example, be realized as a plurality of logic gates. The three bit digital value output by encoder 238 is latched by a register 239. Register 239 is clocked by a clock signal CLK. Digital logic 220, encoder 238 and register 239 are realized in configurable logic blocks of the inner core of the field programmable gate array. Comparators 212, 232, 221–222 and 233 are corresponding structurally identical comparators.

Transistors 240–244 of the interface cell of FIG. 5 correspond to transistors 135–138 and 122 of the interface cell of FIG. 3. An interface cell can be dedicated to supplying the reference voltage VREF to reference voltage conductor 215 by making this transistor conductive. In such a case, the reference voltage would be supplied to the first pad of an interface cell and conducted through the transistor to reference voltage conductor 215. Where interface cells are used to receive digital signals (such as in the example of interface cell 206), the inverting differential input leads of multiple such interface cells are coupled to the same reference voltage conductor. In some embodiments, there is one interface cell dedicated to supplying the reference voltage VREF to the reference voltage conductor 215 for every four interface cells that have comparators coupled to the reference voltage conductor 215.

Performance of the flash analog-to-digital converters of FIGS. 3 and 5 may be limited by the propagation delay of the analog signal VIN to the inverting differential input leads of the comparators of the flash analog-to-digital converter. In the embodiment of FIG. 3, the vertically extending reference voltage conductor 121 that carries the analog signal VIN is made to have a low resistance and a low capacitance. The impedance from pad 123 to the inverting differential input lead of the most distant comparator 114 of the flash analog-to-digital converter may, for example, be approximately 200 ohms into 10 picofarads, limiting response to less than 500 megahertz in one embodiment. Conductor 121 is a metal trace having a width that is greater than the minimum trace width for the semiconductor process used to fabricate the integrated circuit. In one embodiment, minimum trace width is 0.28 microns and conductor 121 is approximately 0.5 microns wide. By proper sizing and layout, the highest practical frequency of operation may approach that of the digital inputs.

The embodiment of FIG. 5 has a comparative advantage in that the analog signal VIN 223 need not be conducted through a long vertically extending reference conductor, but rather the analog signal VIN 223 is supplied to each comparator of the flash analog-to-digital converter via a second pad of the interface cell. In one example of the embodiment of FIG. 5, the impedance from the second pad to the inverting differential input lead of the comparator of the interface cell is approximately 100 ohms into 10 picofarads, limiting response to less than one gigahertz.

Figure 6:
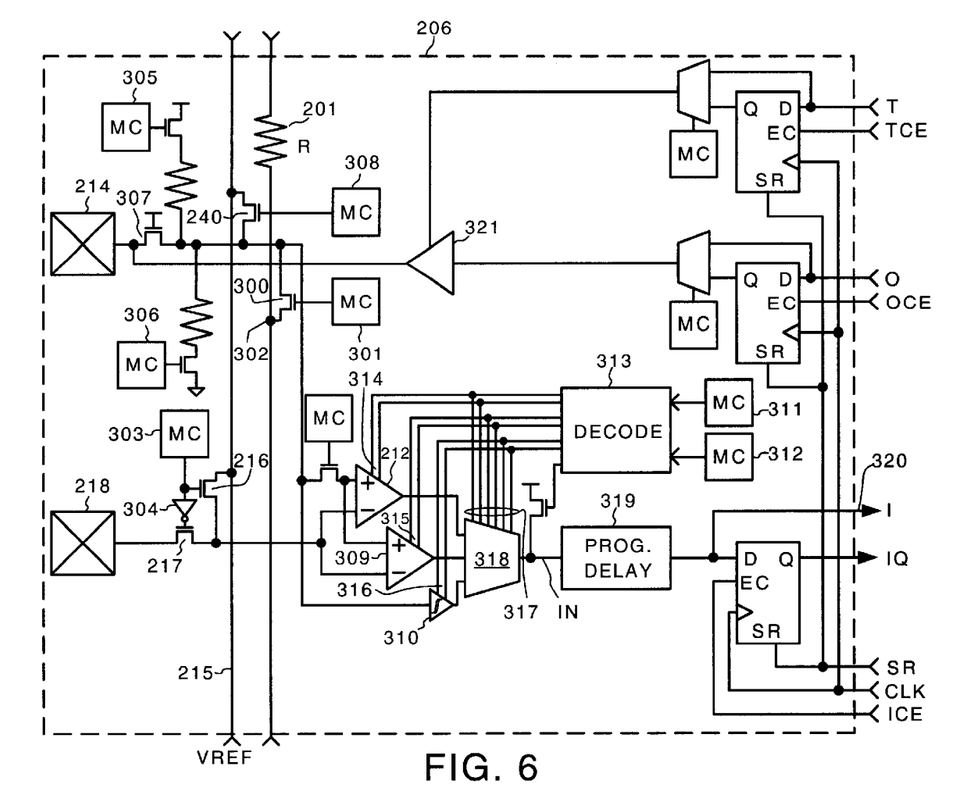
FIG. 6 is a more detailed circuit diagram of an interface cell of the embodiment of FIG. 5.

FIG. 6 is a more detailed diagram of an example of an interface cell 206 of the embodiment of FIG. 5. Interface cell 206 includes the first pad 214, a transistor 300 and memory cell 301 for programmably coupling a noninverting differential input lead of comparator 212 to a tap 302 of a resistor string, the second pad 218, transistors 216 and 217 and memory cell 303 and inverter 304 for programmably coupling an inverting differential input lead of comparator 212 to either the second pad 218 or to the vertically extending reference voltage conductor 215. Reference voltage conductor 215 extends through multiple such interface cells. Each interface cell includes a resistor of the resistor string so that a string of adjoining interface cells forms the resistor string. The memory cells of interface cell 206 have a structure like, are used like, and are programmed like the memory cells used to configure the programmable interconnect structure of field programmable gate arrays available from Xilinx Inc. of San Jose, Calif.

Memory cells 305 and 306 are programmable to provide an internal resistive pullup on first pad 214, an internal pulldown on first pad 214, or a weak keeper on first pad 214. High voltages that might damage the circuitry of the interface cell 206 are prevented from entering the interface cell by input protection transistor 307. The gate of protection transistor 307 is coupled to a voltage slightly higher than supply voltage VCC. The first pad 214 of interface cell 206 can be used to supply a reference voltage VREF onto reference voltage conductor 215 by programming memory cell 308 such that transistor 240 is conductive.

In addition to comparator 212, interface cell 206 has another comparator 309, and a Schmitt trigger 310. Configuration data programmed into memory cells 311 and 312 is decoded by decoder 313 so that a selected one of comparators 212 and 309 and the Schmitt trigger 310 is enabled via enable input leads 314–316. The decoder 313 also drives select signals onto the select input leads 317 of a three-to-one multiplexer 318 so that the signal output from the enabled comparator or Schmitt trigger is conducted to internal node IN and to programmable delay circuit 319. Memory cells (not shown) control the magnitude of delay introduced by programmable delay circuit 319. In an embodiment of the flash analog-to-digital converter, the programmable delay circuit is controlled to introduce as small a delay as possible. The output of the programmable delay circuit 319 is supplied to the encoder 238 (see FIG. 5) via conductor I 320. Interface cell 206 also includes an output buffer 321 that can be enabled to drive a signal onto first pad 214.

Figure 7:
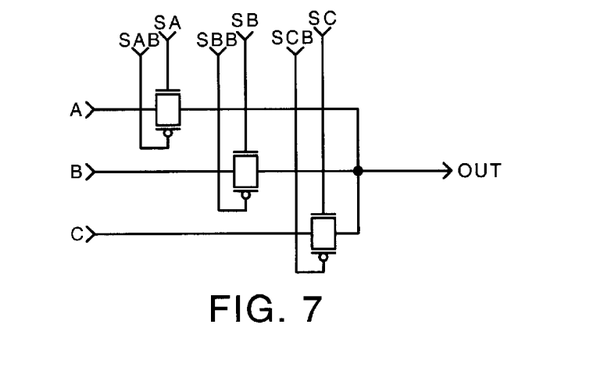
FIG. 7 is a simplified circuit diagram of multiplexer 318 of the interface cell of FIG. 6.

FIG. 7 is a circuit diagram of one example of multiplexer 318 of FIG. 6. Input leads SA, SAB, SB, SBB, SC and SCB correspond to select input leads 317 in FIG. 6. Data input leads A, B and C are coupled to the outputs of comparator 212, comparator 309 and Schmitt trigger 310, respectively. The data output lead OUT is coupled to internal node IN and to the input of programmable delay circuit 319 of FIG. 6.

Figure 8:
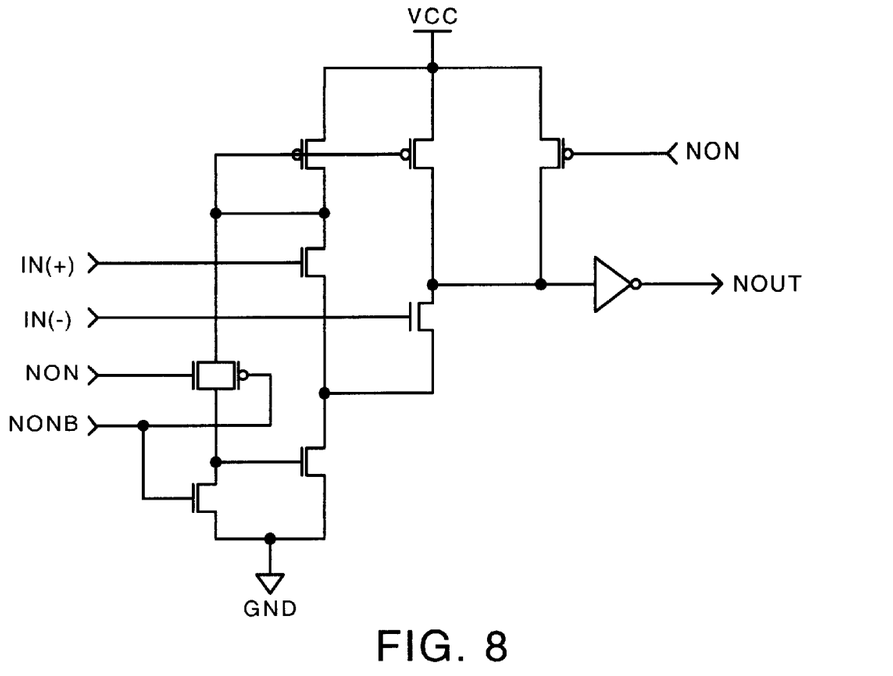
FIG. 8 is a simplified circuit diagram of N-channel comparator 212 of the interface cell of FIG. 6.

FIG. 8 is a circuit diagram of one example of comparator 212 of FIG. 6. This comparator is an N channel comparator provided for amplifying input signals where the reference voltage is greater than about 0.7 volts. Input leads IN(+) and IN(−) are the noninverting differential input lead and the inverting differential input lead of the comparator, respectively. Output lead NOUT is the output lead of the comparator. Input leads NON and NONB correspond to the enable leads 314 of FIG. 6.

Figure 9:
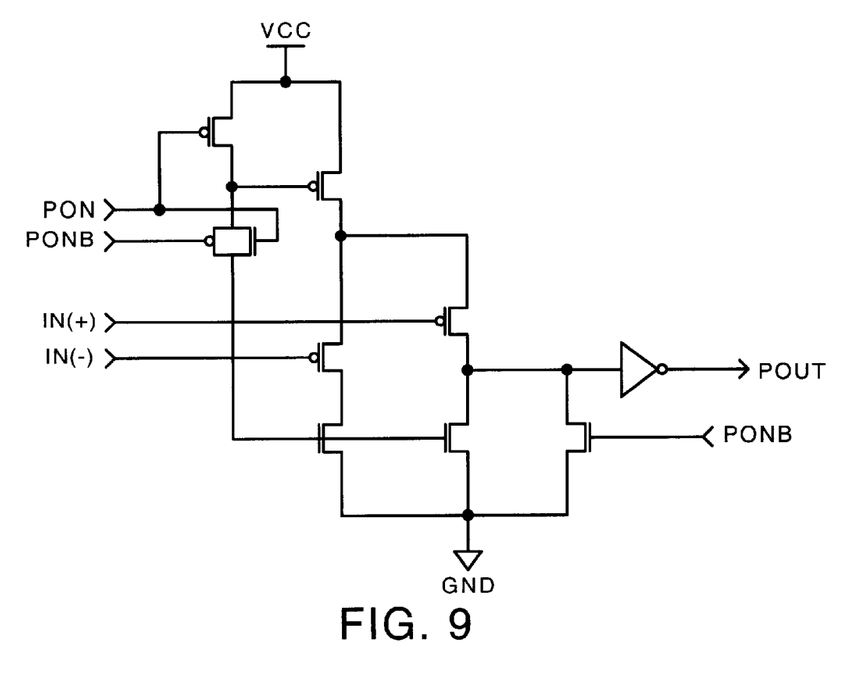
FIG. 9 is a simplified circuit diagram of P-channel comparator 315 of the interface cell of FIG. 6.

FIG. 9 is a circuit diagram of one example of comparator 309 of FIG. 6. This comparator is a P channel comparator provided for amplifying input signals where the reference voltage is about 0.7 volts and below. Input leads IN(+) and IN(−) are the noninverting differential input lead and the inverting differential input lead of the comparator, respectively. Output lead POUT is the output lead of the comparator. Input leads PON and PONB correspond to the enable leads 315 of FIG. 6.

Figure 10:
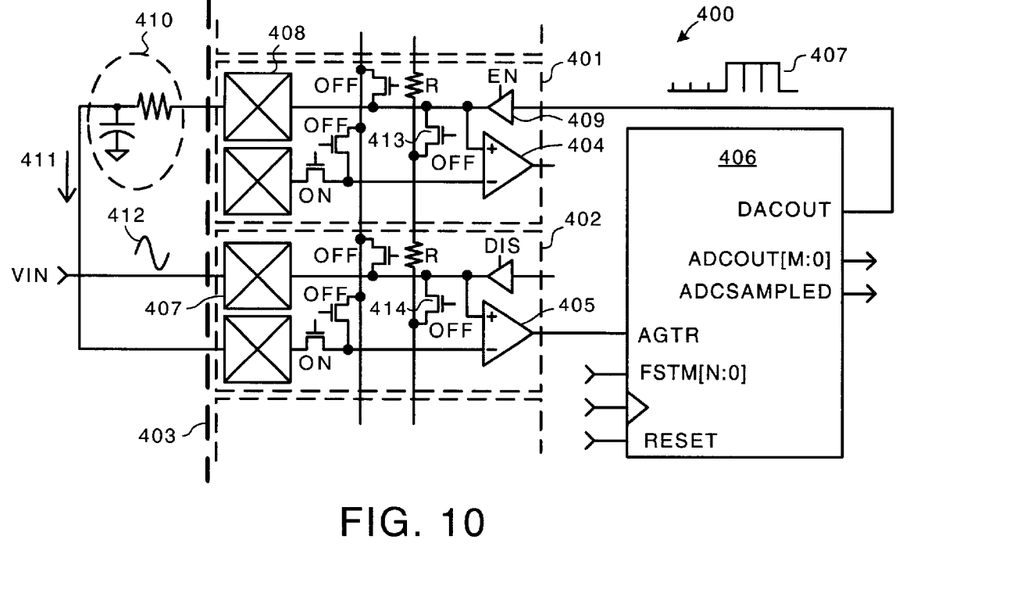
FIG. 10 is a simplified top-down diagram of another embodiment of the present invention wherein a comparator of an interface cell is a comparator in the feedback loop of an analog-to-digital converter. This analog-to-digital converter uses a delta-sigma digital-to-analog converter.

FIG. 10 is a diagram of a part of a field programmable gate array 400 in accordance with another embodiment. A first interface cell (not shown) that is structurally identical to the interface cells 401 and 402 is disposed above interface cell 401 at the edge 403 of the first programmable gate array 400. This interface cell is configured and used so that its comparator that corresponds to comparators 404 and 405 receives a digital signal onto the field programmable gate array from a pad of the interface cell.

Interface cells 404 and 405, on the other hand, are part of an analog-to-digital converter. Circuit 406 outputs a digital duty cycle signal 407 on output DACOUT that has a duty cycle that is increased or decreased depending on a digital value present on an input AGTR (analog greater than reference) of circuit 406. Interface cell 401 is configured as an output cell so that the digital duty cycle signal 407 is driven onto first pad 408 by output buffer 409. A smoothing low pass filter 410 (in this case, an RC filter) is coupled to first pad 408 to generate a feedback signal 411 whose voltage magnitude is an average of the digital duty cycle signal 407. Accordingly, the greater the duty cycle, the higher the voltage of the feedback signal 411. The lower the duty cycle, the smaller the voltage of the feedback signal 411.

Comparator 405 is then used to compare the voltage of feedback signal 411 to an analog input signal VIN 412. If the voltage of analog input signal VIN 412 is smaller than the voltage of feedback signal 411 output by the filter 410, then comparator 405 outputs a digital zero. If, on the other hand, the voltage of analog input signal VIN 412 is greater than the voltage of feedback signal 411 output by the filter 410, then comparator 405 outputs a digital one. Circuit 406 adjusts the duty cycle of digital duty cycle signal 407 using the feedback of feedback signal 411 until the voltage of feedback signal 411 most closely matches the voltage of the analog input signal VIN 412. When this condition is reached, the duty cycle of the digital duty cycle signal 407 is indicative of the magnitude of the analog input signal VIN 412. A multibit digital value indicative of the duty cycle of digital duty cycle signal 407 is output from circuit 406 via digital output leads ADCOUT[M:0]. The interface cell of this field programmable gate array can therefore be configured so that its comparator receives a digital signal onto the field programmable gate array or so that its comparator is part of a successive approximation analog-to-digital converter. Circuit 406 is realized in the core of the field programmable gate array using configurable logic blocks.

In some applications, the resistance and capacitance of an on-chip trace or other structure is used in place of external filter 410, thereby obviating the need for any external circuit components. One or more resistors of the on-chip resistor string can be used for this purpose if the inverting and noninverting differential input leads of comparator 405 are switched, if the polarity of the AGTR input of circuit 406 is reversed, and if transistors 413 and 414 are made to be conductive. Another circuit component such as an integrated metal-plate capacitor (not shown) of the interface cell can be programmably couplable to one of the differential input leads of comparator 405. Although not illustrated in FIG. 10, the various transistors illustrated are controlled by associated memory cells.

For additional details on realizing circuit 406 on a Virtex field programmable gate array available from Xilinx Inc. of San Jose, Calif., see the following two applications notes: "Virtex Analog to Digital Converter" by John Logue (Feb. 22, 1999) and "Virtex Digital to Analog Converter" by John Logue (Feb. 4, 1999). The subject matter of these two application notes is incorporated herein by reference. Verilog code for implementing circuit 406 in a Virtex field programmable gate array available from Xilinx Inc. of San Jose, Calif., is provided in the attached *Paper Appendix*.

In some embodiments, an analog comparator that is specially suited for and intended for analog purposes is provided in the interface cells of a field programmable gate array. Comparator 309 of FIG. 6 may, for example, be replaced with such a dedicated comparator. If first pad 214 is receiving a digital signal, then this digital signal is supplied to internal node IN via comparator 212 and multiplexer 318. Comparator 212 compares the digital signal to a reference voltage VREF on reference voltage conductor 215 as described above. If, on the other hand, first pad 214 is receiving an analog signal, then this analog signal is supplied to the noninverting differential input lead of dedicated comparator 309 and the digital output of comparator 309 is supplied to internal node IN via multiplexer 318. Accordingly, the same pad 214 is usable to receive either a digital signal or an analog signal.

Although the present invention is described in connection with certain specific embodiments for instructional purposes, the present invention is not limited thereto. A comparator that receives an analog signal and outputs a digital signal can be used in analog circuits other than analog-to-digital converters. Analog-to-digital converters other than flash and successive approximation analog-to-digital converters can be realized including integrating analog-to-digital converters, charge balancing analog-to-digital converters, switched capacitor analog-to-digital converters, and analog-to-digital converters employing voltage-to-frequency conversion. Configuring of an interface cell is not limited to the use of memory cells. Antifuses and other programmable elements can be used to configure an interface cell in accordance with some embodiments. Transmission gates involving parallel N-channel and P-channel transistors can be employed to programmably couple conductors together rather than the simple N-channel transistors illustrated in the drawings. Substantially structurally identical interface cells can be mirrored with respect to one another and the various components and structures within substantially structurally identical interface cells can be in different places from one interface cell to another. The digital value output by a flash analog-to-digital converter can be an ordinary binary number or a Gray code. Accordingly, various modifications, adaptations, and combinations of various features of the described embodiments can be practiced without departing from the scope of the invention as set forth in the claims.

What is claimed is:

1. A programmable integrated circuit comprising:
   a plurality of pads;
   means for connecting each of the pads to an external voltage source and through a resistor located on the integrated circuit to an adjacent pad;
   whereby the programmable integrated circuit can be configured to form a resistor chain.

* * * * *